United States Patent
Morche et al.

(10) Patent No.: US 12,092,677 B2
(45) Date of Patent: Sep. 17, 2024

(54) RF SIGNAL DETECTION AND IDENTIFICATION DEVICE

(71) Applicant: COMMISSARIAT A L'ENERGIE ATOMIQUE ET AUX ENERGIES ALTERNATIVES, Paris (FR)

(72) Inventors: Dominique Morche, Grenoble (FR); Naci Pekcokguler, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 162 days.

(21) Appl. No.: 18/054,983

(22) Filed: Nov. 14, 2022

(65) Prior Publication Data

US 2023/0168288 A1  Jun. 1, 2023

(30) Foreign Application Priority Data

Nov. 29, 2021 (FR) ...................... 21 12677

(51) Int. Cl.
*G01R 29/08* (2006.01)
(52) U.S. Cl.
CPC ................. *G01R 29/0878* (2013.01)
(58) Field of Classification Search
None
See application file for complete search history.

(56) References Cited

U.S. PATENT DOCUMENTS

| 8,160,163 B1* | 4/2012 | Yucek | H04L 27/0006 |
| | | | 375/349 |
| 2005/0059364 A1* | 3/2005 | Hansen | H04B 1/1027 |
| | | | 455/73 |
| 2006/0128308 A1* | 6/2006 | Michael | H04W 24/00 |
| | | | 455/161.1 |

FOREIGN PATENT DOCUMENTS

KR  10-2010-0104019 A  9/2010

OTHER PUBLICATIONS

French Preliminary Search Report Issued Jul. 27, 2022, in French Application 21 12677 filed on Nov. 29, 2021 (with English Translation of Categories of Cited Documents), 2 pages.

(Continued)

*Primary Examiner* — Eman A Alkafawi
*Assistant Examiner* — Suresh K Rajaputra
(74) *Attorney, Agent, or Firm* — Oblon, McClelland, Maier & Neustadt, L.L.P.

(57) ABSTRACT

An RF signal detection device, including:
 a first threshold crossing detection circuit comprising an input coupled to an input of the RF signal detection device;
 a first energy detection circuit comprising an input coupled to the input of the RF signal detection device;
 a second threshold crossing detection circuit comprising an input coupled to an output of the first energy detection circuit; and further including a control circuit configured to:
carry out, by the first threshold crossing detection circuit, detection of at least a first threshold crossing frequency in a predetermined RF frequency band; and
carry out, by the first energy detection circuit, energy detection in the predetermined RF frequency band; and
carry out, by the second threshold crossing detection circuit, detection of at least a second threshold crossing frequency of a first energy signal delivered as an output from the first energy detection circuit; and
determine, at least from the first and second threshold crossing frequencies and the first energy signal, whether a single RF signal is present in the RF frequency band.

20 Claims, 2 Drawing Sheets

(56) References Cited

OTHER PUBLICATIONS

Mroue et al., "Performance of a Simple Architecture of an Analog CMOS Detector for MBUWB Receiver", IEEE ICUWB, Sep. 2009, 6 pages.

* cited by examiner

RF SIGNAL DETECTION AND IDENTIFICATION DEVICE

TECHNICAL FIELD

This document relates to the field of integrated circuits for the reception and detection of radio frequency signals, and in particular for the detection of radio frequency spectrum with high consumption restrictions. The invention may be applied in particular to making circuits intended for geographical locating via the detection of the surrounding radio frequency spectrum.

STATE OF PRIOR ART

Unlicensed frequency bands, such as the 2.4 GHz ISM (Industrial, Scientific and Medical) band, are generally highly exploited. Due to the high occupancy rate, communication links operating in these bands have to tolerate interference from other users. Under some circumstances, the interference may be too high to be tolerated, making it necessary to detect other unused frequencies. For this, spectrum detection applications are used.

Accuracy, latency and spectral efficiency are the main criteria considered in spectrum detection applications. These applications generally attempt to detect empty frequency bands in a given spectrum, interference and coexistence with other users.

The methods used in spectrum detection can be classified into two categories: conventional methods and deep learning methods. Conventional methods implement statistical processing of the signals and classification based on features designed by experts. Deep learning methods consist of neural networks that are able to learn and recognise signal features with very little pre-processing of the input signal.

Conventional probability-based methods exploit statistical arguments of communication signals and perform likelihood ratio tests for classification. These methods allow optimal performance to be obtained by minimising false alarms. However, the required computational complexity is very high, especially when the number of unknown parameters is large, making them not adapted to low-power applications.

Classification as a function of the signal features allows sub-optimal performance to be obtained, but requires only simple computations. Feature-based methods are easy to implement and are compatible with low-power applications. However, the increasing number of communication standards makes this technique less interesting.

Methods based on temporal analysis of signals are less efficient against noise and are used with pattern recognition algorithms to increase performance at low SNR (signal to noise ratio). Edge detection in a wavelet transformed signal can be used for empty band detection. The wavelet transform is interesting because it is able to reduce the effects of noise, and it contains information about the time and frequency of the signals. Autocorrelation can also be used to distinguish multi-carrier modulations. Higher order statistics can be used for modulation recognition, as they eliminate the effect of noise and are resistant to phase rotations. Cyclicity analysis gives the correlation of a frequency component in the spectrum with other frequencies. The cyclostationary state of a modulated signal arises from periodic repetitions caused by the symbol rate, data rate, and so on. Therefore, it is suitable for blind recognition applications.

All the features listed above are used with classifiers such as decision tree, k-nearest neighbour search, support vector machines and artificial neural networks.

The main difficulty in designing feature-based classification systems is feature selection rather than classifier selection.

Deep learning methods use DNNs, LSTMs (Long- and Short-Term Memory Recurrent Networks), CNNs (Convolutional Neural Networks) and Residual Network (ResNet) architectures. As deep neural networks can perform very complex classification tasks, applications focus on the recognition and distinction of complex features. Modulation recognition, communication, standards recognition, interference identification and radar signal detection are the main applications of deep learning methods on radio frequency signals.

In contrast, it is possible to carry out spectrum detection based on simple energy detection and by observing the transmission time of the systems present. This technique is very low power but not very robust in a highly used spectrum context. Indeed, energy detection assumes no interference, compressed detection assumes a sparse spectrum, and cognitive radio assumes that a spectrum analyser type RF front end circuit is available. These assumptions are mostly invalid or unrealistic.

DISCLOSURE OF THE INVENTION

Thus there is a need to provide an RF signal detection device that does not have the drawbacks previously described for devices of prior art.

For this, one embodiment provides an RF signal detection device, including at least:

a first threshold crossing detection circuit comprising an input coupled to an input of the device;

a first energy detection circuit comprising an input coupled to the input of the device; and a second threshold crossing detection circuit comprising an input coupled to an output of the first energy detection circuit;

and further including a control circuit configured to:

carry out, by the first threshold crossing detection circuit, detection of at least a first threshold crossing frequency in a predetermined RF frequency band; and carry out, by the first energy detection circuit, energy detection in the predetermined RF frequency band; and carry out, by the second threshold crossing detection circuit, detection of at least a second threshold crossing frequency of a first energy signal delivered as an output from the first energy detection circuit; and determine, at least from the first and second threshold crossing frequencies and the first energy signal, whether a single RF signal is present in the RF frequency band.

This device provides RF signal detection from information extracted by simple electronic circuits, and thus with very low power consumption.

This device in particular provides the judicious use of three features of the signal(s) present in the RF frequency band in order to determine whether a single signal is present in this band. The determination of these three features may be achieved by much simpler electronic circuits than when learning methods are used. The solution provided is also more robust than spectrum detection carried out by energy detection alone.

When no RF signal is detected in the RF frequency band, the control circuit may be configured to repeat the energy detection step with a repetition rate adjusted as a function of features of at least one RF signal to be detected and identified by the device and/or an occupation rate of the RF frequency band. Thus, the power consumption of the device can be reduced by this adjustment of the rate at which the device carries out energy detection, with the device being capable of being switched off when not performing energy detection.

When a single RF signal is detected in the RF frequency band, the control circuit may be configured to repeat the energy detection step so as to define the change of the energy of said detected RF signal as a function of time, and the device may further include one or more circuits for determining at least one of the following features from the values of the energy of said RF signal: pass band, settling time, initial slope, post-settling value, post-settling standard deviation, maximum amplitude (also known as "ringing amplitude").

Each threshold crossing detection circuit may be configured to count, during a given duration, the number of times the signal applied on its input crosses a threshold value.

In this case, the device may further include a device for classifying the detected RF signal at least as a function of the first and second threshold crossing frequencies and the first energy signal.

The device may further include at least a first bandpass filter, the high and/or low cut-off frequencies of which are adjustable, and comprising an output coupled to an input of the first energy detection circuit.

In this case, the control circuit may be configured to repeat the steps of detecting energy, detecting the first and second threshold crossing frequencies and determining the presence of a single RF signal in the RF frequency band by modifying the values of the high and/or low cut-off frequencies of the first bandpass filter so as to carry out these steps for different sub-bands of the RF frequency band, and/or so as to centre and reduce the pass band of the first bandpass filter around a centre frequency of said single RF signal present in the RF frequency band.

According to another configuration, the device may further include:
several second bandpass filters configured to carry out filtering in different frequency sub-bands included in the RF frequency band;
several second energy detection circuits comprising inputs coupled to outputs of the second bandpass filters;
several third threshold crossing detection circuits comprising inputs coupled to outputs of the second bandpass filters; and
several fourth threshold crossing detection circuits comprising inputs coupled to outputs of the second energy detection circuits;
and the control circuit may be configured to:
carry out, by the third threshold crossing detection circuit, detection of at least a third threshold crossing frequency in the frequency sub-bands;
carry out, by the second energy detection circuits, energy detection in the frequency sub-bands; and
carry out, by the fourth threshold crossing detection circuit, detection of at least a fourth threshold crossing frequency of second energy signals delivered as an output from the second energy detection circuits;
determine, at least from the third and fourth threshold crossing frequencies and the second energy signals, the presence of a single RF signal in each of the frequency sub-bands.

In this case, the high and/or low cut-off frequencies of the second bandpass filters may be adjustable, and the control circuit may be configured to repeat the steps of detecting energy in the frequency sub-bands, detecting the third and fourth threshold crossing frequencies and determining the presence of a single RF signal in each of the frequency sub-bands by modifying the values of the high and/or low cut-off frequencies of the second bandpass filters so as to carry out these steps for different sub-bands of the RF frequency band, and/or so as to centre and reduce the pass bands of the second bandpass filters around centre frequencies of RF signals present in the frequency sub-bands.

Furthermore, the control circuit may be configured to repeat the implementation of the steps of detecting energy in the frequency sub-bands, detecting the third and fourth threshold crossing frequencies and determining the presence of a single RF signal in each of the frequency sub-bands by choosing time instants for implementing these steps so as to avoid the presence of one or more undesired signals in the spectrum obtained as an output of the second bandpass filters and/or cancelling one or more previously identified signals.

The first energy detection circuit and/or each second energy detection circuit may include a circuit for computing the square or absolute value of a signal applied as an input of said energy detection circuit.

Alternatively, the first energy detection circuit and/or each second energy detection circuit may include an envelope detector circuit of a signal applied as an input of said energy detection circuit, as a detection of an envelope of a signal corresponds to an energy detection.

In addition, the first energy detection circuit and/or each second energy detection circuit may include a low-pass filter comprising an input coupled to an output of the computational circuit, wherein an output of the low-pass filter may form an output of the energy detection circuit.

The device may further include at least a first high-pass filter, an input of which is coupled to an output of the first energy detection circuit and an output of which is coupled to an input of the second threshold crossing detection circuit, and/or at least a second high-pass filter, an input of which is coupled to outputs of the second energy detection circuits and an output of which is coupled to an input of the fourth threshold crossing detection circuit.

In this case, the device may further include a peak value detection device comprising an input coupled to an output of the first high-pass filter, and an output of which is coupled to an input of a maximum or ringing amplitude determination circuit, and/or at least a second peak value detection device comprising an input coupled to an output of the second high-pass filter, and an output of which is coupled to an input of a maximum amplitude determination circuit.

The device may further include:
a low noise amplifier comprising an input for receiving the RF signal(s) present in the RF frequency band;
a multiplier comprising a first input coupled to the output of the low noise amplifier, and a second input coupled to an output of a local oscillator;
a third bandpass filter comprising an input coupled to the output of the multiplier and an output coupled to the input of the first energy detection circuit and, when the device includes the second energy detection circuits, to the input of the second energy detection circuits.

Another embodiment relates to a locating device including at least one RF signal detection device as previously described. Such a locating device may be used to operate in the RF frequency band between 2.4 GHz and 2.5 GHz.

BRIEF DESCRIPTION OF THE DRAWINGS

The present invention will be better understood upon reading the description of exemplary embodiments given purely for indicative and in no way limiting purposes by referring to the appended drawings in which.

Identical, similar or equivalent parts of the different figures described below bear the same numerical references so as to facilitate switching from one figure to another.

The different parts shown in the figures are not necessarily to a uniform scale so as to make the figures more legible.

The various possibilities (alternatives and embodiments) should be understood as not being mutually exclusive and may be combined with each other.

DETAILED DISCLOSURE OF PARTICULAR EMBODIMENTS

An RF signal detection device 100 according to one embodiment is described above in connection with FIGS. 1 and 2, FIG. 1 schematically showing, as a flow chart, the functions implemented by the device 100, and FIG. 2 schematically showing the device 100 according to this particular embodiment.

Figure 1:
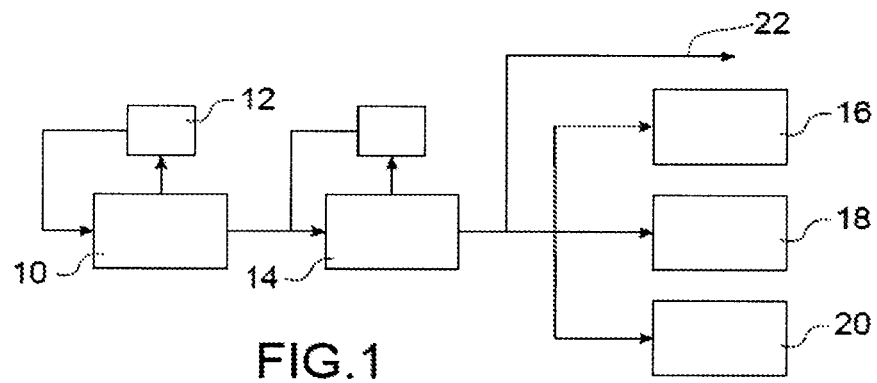
FIG. 1 schematically shows, as a flow chart, the functions implemented by an RF signal detection and identification device.

The device 100 carries out energy detection in a predetermined RF frequency band received as an input of the device 100, for example via a receiving antenna (not shown), for the purpose of determining whether a single signal is present in that frequency band. In the particular embodiment described herein, the RF frequency band in which one or more signals are sought corresponds to the Wi-Fi frequency band between 2.4 GHz and 2.5 GHz. This energy detection is shown in FIG. 1 by block 10. This energy detection is for example carried out with a high gain and low linearity.

Figure 2:
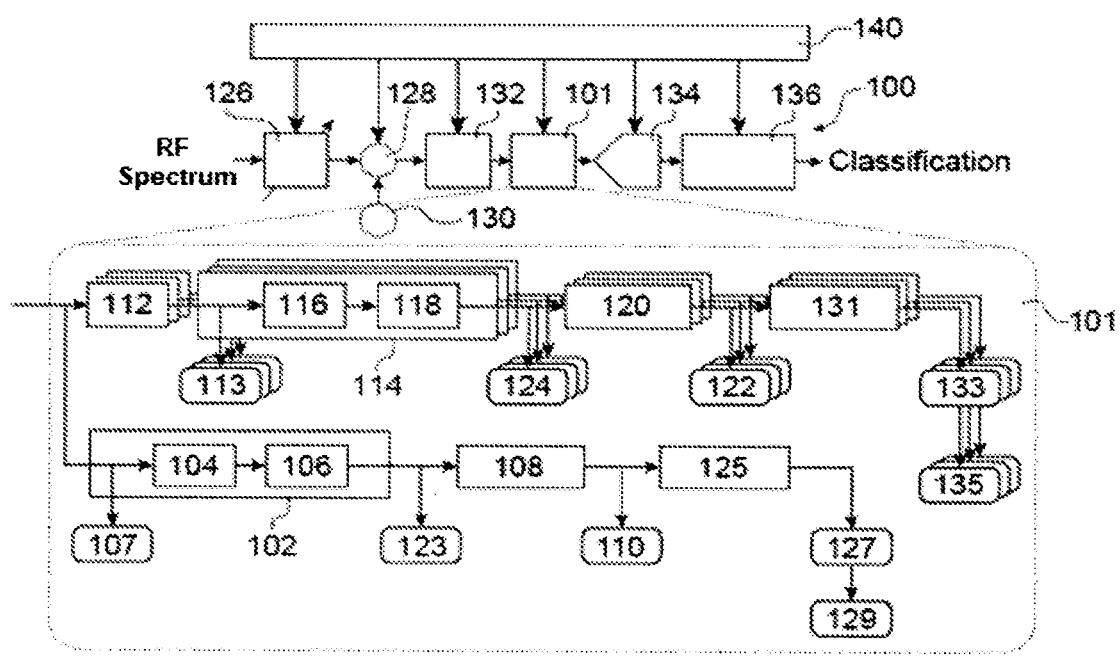
FIG. 2 schematically shows an RF signal detection and identification device according to a particular embodiment.

To carry out this energy detection, the device 100 includes a first energy detection circuit 102. This first circuit 102 is non-linear. In the example of FIG. 2, the first circuit 102 includes a circuit 104 for computing the square or the absolute value of the signal(s) present in the RF frequency band under investigation. Such a circuit 104 for computing the square of the RF signal(s) includes, for example, a rectifier that keeps only positive signals or a diode-based rectifier circuit or a circuit computing the absolute value of the signal. This computation of the square of the RF signal(s) may be carried out by a mixer or a differential circuit as described for example in "Performance of a Simple Architecture of an Analog CMOS Detector for MB-UWB Receiver" by M. Mroue et al, IEEE ICUWB, September 2009, Vancouver, Canada. pp. 107-112. Alternatively, the circuit 104 may correspond to an envelope detector circuit.

The first circuit 102 also includes, in the example of FIG. 2, a low-pass filter 106 used to stabilise the signal delivered as an output from the circuit 104 by averaging the energy of this signal over a certain period. The cut-off frequency of this filter 106 is advantageously chosen so that it is neither too low (which allows good accuracy of the energy but with, on the other hand, a long measurement duration) nor too high (fast but not very accurate measurement). For example, the torque frequency of the low-pass filter 106 may be between the value of the signal pass band and ⅕ of this value. For example, such a low-pass filter 106 includes a current source coupled to a capacitor.

This energy detection is repeated until non-zero energy is detected in the RF frequency band, meaning that at least one signal is present in the RF frequency band in which the detection is carried out. In the absence of energy detection, the rate at which the first circuit 102 carries out the energy detection and/or the duration for which each energy detection is carried out by the first circuit 102 is adjusted as a function of the features of a signal or signals sought and/or an occupancy rate of the RF frequency band. This adjustment of the repetition rate with which the first circuit 102 carries out the energy detection is shown in FIG. 1 by block 12.

Between two consecutive energy detections, the device 100 may be put into a reduced operating state, or standby, in which some circuits of the device 100 are not powered, thereby allowing the power consumption of the device 100 to be reduced.

When non-zero energy is detected in the RF frequency band, the device 100 determines whether an RF signal is present in the RF frequency band (block 14 of FIG. 1). For this, in the example of FIG. 2, the RF signal received is applied as an input of a first threshold crossing detection circuit 107. This circuit 107 counts, during a given period, how many times the detected signal will cross a threshold value which corresponds for example to 0 (with in this case the circuit 107 corresponding to a ZCR detector). The value obtained as an output of the circuit 107 makes it possible to determine the average frequency of the signal received and therefore gives an image of the distribution of the energy in the frequency band considered.

This frequency determination is also carried out on the signal representing the energy of the RF signal. For this, the signal obtained as an output of the first circuit 102 is applied as an input of a first high-pass filter 108 which removes the DC component of the signal(s) present in the RF frequency band. The signal obtained as an output of the first high-pass filter 108 is applied as an input of a second threshold crossing detection circuit 110 which operates similarly to the circuit 107. The value obtained as an output of the circuit 110 allows the average frequency of the energy of the signal received to be determined.

From at least the three determined features (first threshold crossing frequency obtained as an output of the circuit 107, energy detected by the circuit 102, second threshold crossing frequency obtained as an output of the circuit 110), the device 100 determines whether a single RF signal is present in the RF frequency band considered. The energy received gives the probability that a signal is present; the rate of threshold crossings gives the value of the carrier frequency of the RF signal and hence its position in the spectrum, and the threshold crossings as an output of the energy detection give an estimate of the pass band and hence the type of signal present.

When one or more RF signals are detected in the RF frequency band, the energy detection steps may be repeated so as to define the change of the energy of the detected RF signal(s) as a function of time.

In the exemplary embodiment shown in FIG. 2, the device 100 further includes circuits for determining features of the detected RF signal(s):

a circuit 123 determining, from the signal obtained as an output of the first circuit 102, the settling time of the detected RF signal(s). For example, to measure the settling time, the circuit 123 may carry out a comparison between two different integrations of the detected energy obtained using different cut-off frequencies in the low-pass filter 106 of the energy detection circuit 102. The settling time is then determined by detecting the crossing of the two obtained functions, or by sampling several values obtained as an output of the two integrations;

a peak value detector 125 receiving as an input the signals delivered as an output from the first high-pass filter 108. This detector 125, also called "peak detector", includes for example an integrator circuit;

a circuit 127 determining, from a signal delivered by the detector 125, the maximum amplitude of the RF signal(s);

a circuit 129 determining, from a signal delivered by the circuit 127, the pass band of the RF signal(s).

Other features of the detected RF signal(s) may be determined, such as for example the initial slope of the energy and/or the post-settling value of the energy and/or the post-settling standard deviation of such signal(s).

In the device 100 according to the particular embodiment described herein, signal detection is carried out simultaneously in the entire RF frequency band by the previously described circuits, and also in one or more sub-bands of the RF spectrum in order to refine the characterization of the signal(s) present in the RF frequency band. For this, detection and characterization are carried out in the entire RF spectrum band by the previously described elements 102, 107, 108, 110, 123, 125, 127 and 129 which form a first detection chain, and detection in one or more frequency sub-bands is carried out by other similar elements and which form one or more other detection chains.

Thus, the device 100 includes several bandpass filters 112 receiving the RF spectrum to be analysed as an input, each detection chain including one of these bandpass filters 112. The output of each of the filters 112 is coupled as an input of a third threshold crossing detection circuit 113 for example identical to the circuit 107 previously described. The output of each of the filters 112 is also coupled to the input of a second energy detection circuit 114. These second circuits 114 are for example identical to the first circuit 102 previously described and each include for example a circuit 116 for computing the square or absolute value of the sub-band of the RF spectrum applied to its input, and a low-pass filter 118 for stabilising the signal delivered as an output from the circuit 116. The outputs of these detection chains are each coupled to the input of a second high-pass filter 120 which removes the DC component of the signal(s) present in each sub-band of the RF spectrum, and to the input of a settling time determination circuit 124, for example identical to the circuit 123. The signal obtained at the output of each second high-pass filter 120 is sent to the input of a second threshold crossing detection circuit 122, for example identical to the circuit 110, and to the input of a peak value detector 131, for example identical to the detector 125. The output of each detector 131 is coupled to the input of a circuit 133 for example identical to the circuit 127, and the output of each circuit 133 is coupled to the input of a circuit 135 for example identical to the circuit 129.

Other features of the RF signal(s) present in the RF sub-bands may be determined, such as for example the initial slope of the energy and/or the post-settling value of the energy and/or the post-settling standard deviation of such signal(s).

As a function of the information obtained with the previously described elements of the device 100 and the information sought, several additional steps may be implemented by the device 100, corresponding to several operating modes of the device 100, in order to complete these preceding steps and refine the detection and identification of signals present in the RF spectrum.

In a first operating mode, if the information previously obtained is sufficient, it is possible to carry out a classification and/or counting of the previously identified signals. The classification is carried out from the features of the signals that have been determined. This first mode is represented in FIG. 1 by block 16. The classification carried out may correspond, for example, to a ranking of the signals detected according to their type (Wi-Fi, Bluetooth, Microwave, etc.), their standard (802.11b, 802.11g, etc.), their pass band, their rate, etc.

In a second operating mode, the steps previously implemented may be repeated in one or more other sub-bands of the RF spectrum comprising one or more signals sought. This second mode corresponds to block 18 represented in FIG. 1.

In a third mode, it is possible to repeat the steps previously implemented by masking one or more undesired signals in the spectrum, when such undesired signals have been previously identified. For this, it is possible to choose the time instants for implementing the frequency identification steps so as to avoid the presence of such undesired signal(s) in the analysed spectrum and/or to cancel such previously identified signal(s) in the analysed spectrum (via a subtraction of such signal(s)). This amounts to increasing the processing dynamics of the receive chain by separating the signals by virtue of the second bandpass filters 112 by taking advantage of the analysis of the strongest signal(s) in a dedicated filter and cancelling such signal(s) through a feedback loop. This third mode is symbolised by block 20 in FIG. 1.

Figure 3:
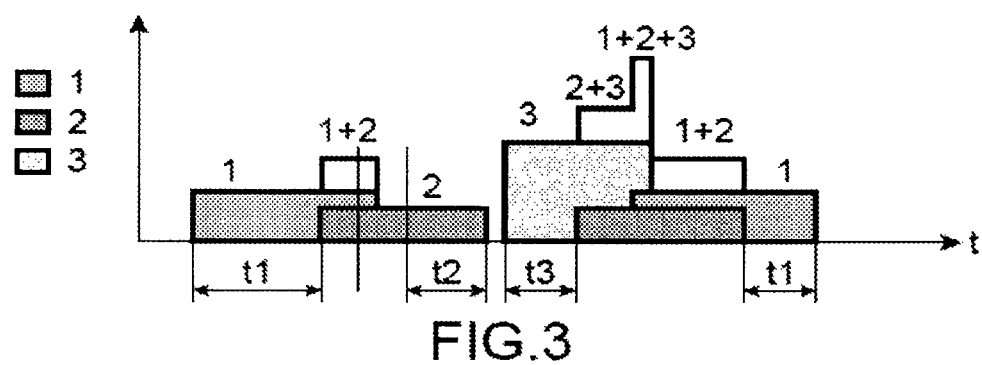
FIG. 3 shows an example of change over time of the energy in an RF frequency band in the presence of three signals.

FIG. 3 illustrates an example of the time change of the energy in an RF frequency band in the presence of three signals referenced 1, 2 and 3. It is seen from this figure that by judiciously choosing the time instants for implementing the various preceding steps, it is possible to implement these steps in the presence of the desired signal only. For example, in FIG. 3, the periods t1 correspond to periods during which only signal 1 is present, the period t2 corresponds to a period during which only signal 2 is present, and the period t3 corresponds to a period during which only signal 3 is present.

If the spectrum is too dense or too complex to be analysed by the device 100, then it is possible to resort to a conventional high dynamic range receive chain to process the signals. This possibility is represented by the arrow bearing the reference 22 in FIG. 1.

The device 100 may switch from one operating mode to another depending on the results obtained. The switching time from one mode to the other may be very fast, as in establishing a feedback loop as soon as a strong signal is detected.

In addition to the previously described elements which together form a detection circuit 101 within the device 100, the device 100 shown in FIG. 2 also includes:

a low noise amplifier 126 comprising an input configured to receive the RF frequency band;

a multiplier 128 comprising a first input coupled to the output of the low noise amplifier 126, and a second input coupled to an output of a local oscillator 130;

a third bandpass filter 132 comprising an input coupled to the output of the multiplier 128 and an output coupled to the input of the detection circuit 101, that is, to the inputs of the bandpass filters 112 and to the input of the first circuit 102.

an analogue-to-digital converter 134 receiving as an input the features of the detected signals;

a device 136 for classifying and/or counting the detected signals. In order to carry out classification of the signals, the device 136 may implement deterministic algorithms or data processing of the artificial intelligence type, such as machine learning.

The driving of the device 100, that is, the sending of signals into the various circuits of the device 100 and the parameterisation of these circuits, is carried out by a control circuit 140.

In an alternative embodiment of the device 100, it is possible that the device 100 includes only the first detection chain formed by the elements 102, 107, 108 and 110 and not the second detection chains formed by the elements 112, 114, 120 and 122. In this case, the device 100 includes a bandpass filter, for example similar to one of the filters 112, coupled to the input of the first energy detection circuit 102. In this way, the device 100 can sequentially carry out signal detections in different sub-bands of the RF frequency band. Advantageously, the signal detections are carried out in initially wide and then reduced frequency bands in order to minimally penalise the operating speed of the device 100.

In the previously described exemplary embodiments, the threshold crossing detection circuits 110, 122 are configured to detect a crossing with a threshold value equal to zero. Alternatively, it is possible that this threshold value is different from 0.

The various circuits of the device 100 may be made as a semiconductor chip.

Advantageously, the device 100 may be used as a locating device via Wi-Fi signal detection. In this case, the device 100 can extract identification data from the transmitter of the detected Wi-Fi signals and thus be able to perform locating of the object equipped with the device 100. Such a locating device may for example be made as a chip integrated in a locating tag, and has the advantage of having a very low power consumption locating functionality.

Indeed, to determine an approximate position of an RF signal transmitter, it is interesting to identify which radio signals are available, for example by determining which base stations are in the proximity of the device 100, which Wi-Fi terminals are available or which TV signal bands are used. Unlike a Wi-Fi receiver that regularly scans ISM (industrial, scientific and medical) frequencies to detect the presence of Wi-Fi signals, and that can spend a lot of energy unnecessarily when few radio signals are available, in particular in rural zones, the device 100 allows the presence of these signals to be detected with very low power consumption by having a system dedicated to this functionality. For example, once a Wi-Fi signal is detected by the device 100, it is possible to turn on a Wi-Fi receiver of the device 100 which will go and read the identifier of the detected transmitting terminal, by recovering the header of the detected signal. The recovered identifier may be sent and compared in a database to identify the transmitting terminal, and thus locate this terminal and therefore also locate the device 100. In the device 100, the Wi-Fi receiver is only used when necessary, which decreases the energy dissipation.

The device 100 may also be used to monitor the level of interference in one or more given frequency bands and thus adapt the power consumption of a communication system using such frequency band(s).

The invention claimed is:

1. An RF signal detection device, including at least:
   a first threshold crossing detection circuit comprising an input coupled to an input of the RF signal detection device;
   a first energy detection circuit comprising an input coupled to the input of the RF signal detection device;
   a second threshold crossing detection circuit comprising an input coupled to an output of the first energy detection circuit;
   and further including a control circuit configured to:
   carry out, by the first threshold crossing detection circuit, detection of at least a first threshold crossing frequency in a predetermined RF frequency band;
   carry out, by the first energy detection circuit, energy detection in the predetermined RF frequency band; and
   carry out, by the second threshold crossing detection circuit, detection of at least a second threshold crossing frequency of a first energy signal delivered as an output from the first energy detection circuit;
   determine, at least from the first and second threshold crossing frequencies and the first energy signal, whether a single RF signal is present in the RF frequency band.

2. The RF signal detection device according to claim 1, wherein, when no RF signal is detected in the RF frequency band, the control circuit is configured to repeat the energy detection step with a repetition rate adjusted as a function of features of at least one RF signal to be detected and identified by the RF signal detection device and/or an occupancy rate of the RF frequency band.

3. The RF signal detection device according to claim 1, wherein, when a single RF signal is detected in the RF frequency band, the control circuit is configured to repeat the energy detection step so as to define the change of the energy of said detected RF signal as a function of time, and wherein the RF signal detection device further includes one or more circuits for determining at least one of the following features from the energy values of said RF signal: pass band, settling time, initial slope, post-settling value, post-settling standard deviation, maximum amplitude.

4. The RF signal detection device according to claim 1, further including a device for classifying the detected RF signal at least as a function of the first and second threshold crossing frequencies and the first energy signal.

5. The RF signal detection device according to claim 1, further including at least a first bandpass filter, high and/or low cut-off frequencies of which are adjustable, and comprising an output coupled to an input of the first energy detection circuit.

6. The RF signal detection device according to claim 5, wherein the control circuit is configured to repeat the steps of detecting energy, detecting the first and second threshold crossing frequencies and determining the presence of a single RF signal in the RF frequency band by modifying the values of the high and/or low cut-off frequencies of the first bandpass filter so as to carry out these steps for different sub-bands of the RF frequency band, and/or so as to centre and reduce the pass band of the first bandpass filter around a centre frequency of said single RF signal present in the RF frequency band.

7. The RF signal detection device according to claim 1, further including:
   several second bandpass filters configured to carry out filtering in different frequency sub-bands included in the RF frequency band;

several second energy detection circuits comprising inputs coupled to outputs of the second bandpass filters;

several third threshold crossing detection circuits comprising inputs coupled to outputs of the second bandpass filters;

several fourth threshold crossing detection circuits comprising inputs coupled to outputs of the second energy detection circuits;

and wherein the control circuit is configured to:

carry out, by the third threshold crossing detection circuit, detection of at least a third threshold crossing frequency in the frequency sub-bands;

carry out, by the second energy detection circuits, energy detection in the frequency sub-bands; and carry out, by the fourth threshold crossing detection circuit, detection of at least a fourth threshold crossing frequency of second energy signals delivered as an output from the second energy detection circuits;

determine, at least from the third and fourth threshold crossing frequencies and the second energy signals, the presence of a single RF signal in each of the frequency sub-bands.

8. The RF signal detection device according to claim 7, wherein high and/or low cut-off frequencies of the second bandpass filters are adjustable, and wherein the control circuit is configured to repeat the steps of detecting energy in the frequency sub-bands, detecting the third and fourth threshold crossing frequencies and determining the presence of a single RF signal in each of the frequency sub-bands by modifying the values of the high and/or low cut-off frequencies of the second bandpass filters so as to carry out these steps for different sub-bands of the RF frequency band, and/or so as to centre and reduce the pass bands of the second bandpass filters around centre frequencies of RF signals present in the frequency sub-bands.

9. The RF signal detection device according to claim 7, wherein the control circuit is configured to repeat the implementation of the steps of detecting energy in the frequency sub-bands, detecting the third and fourth threshold crossing frequencies and determining the presence of a single RF signal in each of the frequency sub-bands by choosing time instants for implementing these steps so as to avoid the presence of one or more undesired signals in the spectrum obtained as an output of the second bandpass filters and/or cancelling one or more previously identified signals.

10. The RF signal detection device according to claim 1, wherein the first energy detection circuit includes a circuit for computing the square or absolute value of a signal applied as an input of the first energy detection circuit.

11. The RF signal detection device according to claim 10, wherein the first energy detection circuit includes a low-pass filter comprising an input coupled to an output of the computational circuit, an output of the low-pass filter forming an output of the energy detection circuit.

12. The RF signal detection device according to claim 7, wherein each second energy detection circuit includes a circuit for computing the square or absolute value of a signal applied as an input of said energy detection circuit.

13. The RF signal detection device according to claim 12, wherein each second energy detection circuit includes a low-pass filter comprising an input coupled to an output of the computational circuit, an output of the low-pass filter forming an output of the energy detection circuit.

14. The RF signal detection device according to claim 1, further including at least a first high-pass filter, an input of which is coupled to an output of the first energy detection circuit and an output of which is coupled to an input of the second threshold crossing detection circuit.

15. The RF signal detection device according to claim 14, further including a peak value detection device comprising an input coupled to an output of the first high-pass filter, and an output of which is coupled to an input of a maximum amplitude value determination circuit.

16. The RF signal detection device according to claim 7, further including at least a second high-pass filter, an input of which is coupled to outputs of the second energy detection circuits and an output of which is coupled to an input of the fourth threshold crossing detection circuit.

17. The RF signal detection device according to claim 16, further including a second peak value detection device comprising an input coupled to an output of the second high-pass filter, and an output of which is coupled to an input of a maximum amplitude value determination circuit.

18. The RF signal detection device according to claim 1, further including:
a low noise amplifier comprising an input for receiving the RF signal or RF signals present in the RF frequency band;
a multiplier comprising a first input coupled to the output of the low noise amplifier, and a second input coupled to an output of a local oscillator;
a third bandpass filter comprising an input coupled to the output of the multiplier and an output coupled to the input of the first energy detection circuit.

19. The RF signal detection device according to claim 7, further including:
a low noise amplifier comprising an input for receiving the RF signal or RF signals present in the RF frequency band;
a multiplier comprising a first input coupled to the output of the low noise amplifier, and a second input coupled to an output of a local oscillator;
a third bandpass filter comprising an input coupled to the output of the multiplier and an output coupled to the input of the first energy detection circuit and to the input of the second energy detection circuits.

20. A locating device including at least one RF signal detection device according to claim 1.

* * * * *